United States Patent [19]
Nishimuta et al.

[11] Patent Number: 5,892,653
[45] Date of Patent: Apr. 6, 1999

[54] MULTI-TAP DISTRIBUTION BOX

[75] Inventors: Hiroyuki Nishimuta; Hiroyuki Mizutani, both of Nisshin, Japan

[73] Assignee: Maspro Denkoh Company, Ltd., Aichi, Japan

[21] Appl. No.: 793,409

[22] PCT Filed: Jun. 24, 1996

[86] PCT No.: PCT/JP96/01735

§ 371 Date: May 19, 1997

§ 102(e) Date: May 19, 1997

[87] PCT Pub. No.: WO97/01220

PCT Pub. Date: Jan. 9, 1997

[30] Foreign Application Priority Data

Jun. 23, 1995 [JP] Japan .................................. 7-158116

[51] Int. Cl.⁶ .................................................. H02B 1/04
[52] U.S. Cl. ........................ 361/643; 174/59; 200/51.1; 333/100; 361/736; 361/752; 455/6.2
[58] Field of Search .......................... 174/59; 200/51.1; 333/100, 112, 116, 128, 136; 361/643, 728, 730, 732, 733, 736, 752, 803, 826–828; 439/63; 455/6.2

[56] References Cited

U.S. PATENT DOCUMENTS

| 3,617,811 | 11/1971 | McVoy | 317/99 |
|---|---|---|---|
| 3,895,318 | 7/1975 | Ross | 333/6 |
| 4,578,702 | 3/1986 | Campbell | 174/59 |
| 5,648,765 | 7/1997 | Spriester et al. | 333/100 |
| 5,675,300 | 10/1997 | Romerein | 361/736 |

FOREIGN PATENT DOCUMENTS

| 50-73511 | 6/1975 | Japan . |
|---|---|---|
| 50-73512 | 6/1975 | Japan . |
| 53-38568 | 10/1978 | Japan . |
| 57-38865 | 8/1982 | Japan . |
| 61-6691 | 2/1986 | Japan . |

Primary Examiner—Gregory Thompson
Attorney, Agent, or Firm—Pearson & Pearson

[57] ABSTRACT

A multi-tap distribution box is disclosed in which the positions of the input terminal and the output terminal are selectable. A housing (1) has in the center portion thereof an attachment portion (5) on which main line terminals (5a, 5b, and 5c) are provided. Two terminals are located above, and on both sides of the center of, the housing (1) while the other terminal is located directly under one of the two terminals. A mother board (6) with transmission terminals (7) is mounted on the attachment portion (5) so that the transmission terminals (7) are connected to a select pair of the main line terminals. A branch unit (15) which includes a branch terminal (17) is detachably mounted on the mother board (6) on which a main body (21) with a tap board (20) is in turn mounted. When the main body (21) is mounted, an input terminal (23) provided on the tap board (20) is connected to the branch terminal (17) of the branch unit (15).

8 Claims, 5 Drawing Sheets

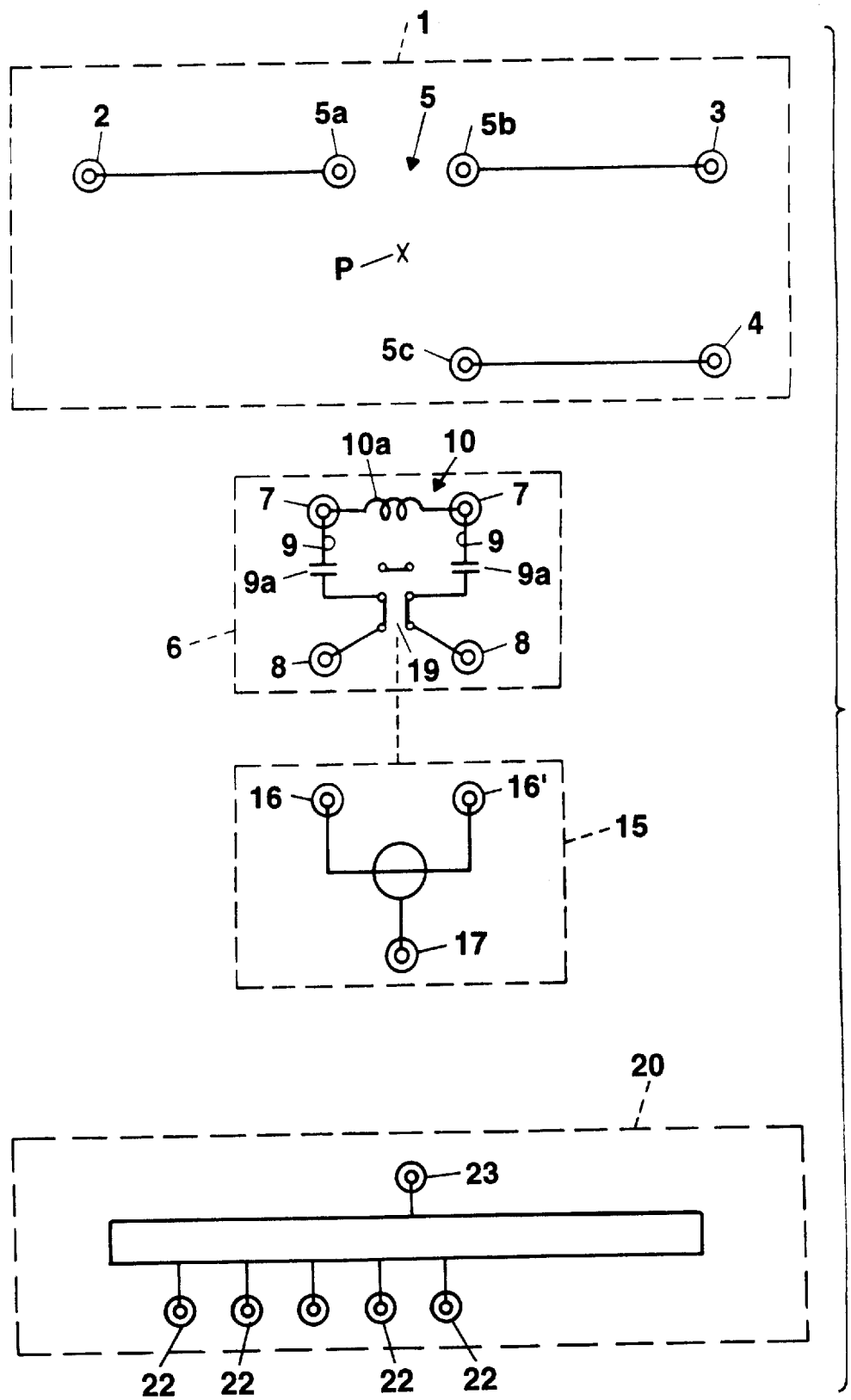

MULTI-TAP DISTRIBUTION BOX

FIELD OF THE ART

The present invention relates to a multi-tap distribution box. More particularly, the present invention relates to a multi-tap distribution box which is suitable for use with CATV (community antenna television system) cables.

TECHNICAL BACKGROUND

Generally, CATV cables are laid underground or aerially strung on telephone poles. The number of secondary cables branching out from a multi-tap distribution box varies depending on the number of subscribers to be connected to.

As shown in FIG. 5A (PRIOR ART), a typical aerial multi-tap distribution box generally has an input A and an output terminal B on the opposite end surfaces. As shown in FIG. 5B (PRIOR ART), a typical pedestal multi-tap distribution box, the type for used with cables laid underground, has both input and output terminals A and B on the same surface. Many different models with different numbers of taps to which secondary cables are connected are manufactured to suit particular applications.

CATV cables that are already laid or aerially hung may require various changes and adjustments in the future: the direction of the signal transmission may be reversed, aerial cables may need to be laid underground, or underground cables may be hung on poles. To effect such change, however, the existing cables need to be reconnected in different locations, so that the multi-tap distribution box often needs to be replaced with a new one. In addition, cable reconnection often involves a change in the number of the secondary branch cables. When the existing multi-tap distribution box is replaced with another with the required number of taps, the high-frequency signal transmission and the electrical current flow have to be temporarily interrupted.

DISCLOSURE OF THE INVENTION

In accordance with the present invention there is provided a multi-tap distribution box which enables the reversal of the transmission direction and which is reconnectable from aerial cables to underground cables, or vice versa.

The multi-tap distribution box is constructed by:

a housing having one cable connecting member on one end thereof and two cable connecting members on the other end;

the housing further having equally spaced pairs of main line terminals arranged on the center portion thereon, each of the main line terminals being electrically connected to a different cable connecting member;

a mother board having thereon transmission terminals spaced from each other so as to correspond to the distance between a pair of main line terminals, the transmission terminals being connected to each other by a current transmission circuit;

the mother board having further thereon two relay terminals each of which is connected to one of the transmission terminals so that high-frequency signals are transmittable between each pair of a relay terminal and a transmission terminal, the mother board being detachably mounted on the housing so as to connect the transmission terminals of the mother board to a select pair of main line terminals on the housing;

a branch unit having a branch circuit, a pair of connection terminals, and a branch terminal, the branch unit being detachably mounted on the mother board for connecting the connection terminals to the relay terminals of the mother board;

a tap board with a distributing circuit and an input terminal, the tap board being mounted on a main body; and the input terminal of the tap board adapted for connection to the branch terminal of the branch unit.

The high-frequency signals mentioned above includes television signals, various control signals, and telephone signal-like modulating signal used for communication.

The number of the main line terminals arranged on the housing may be three with two of the terminals located above, and on the right and left sides of the center of, the housing and the remaining terminal vertically aligned with one of the two terminals.

Preferably, the branch unit has claws or guide lugs on both ends thereof so that the branch unit can be detachably mounted on the mother board by engaging the claws with holes formed in the mother board or inserting the guide lugs into the holes.

In carrying out the invention in one preferred mode, the mother board further includes a switch which operates in response to the mounting and detachment of the branch unit in order to short-circuiting the relay terminals when the branch unit is detached from the mother board.

The input and output cable terminals can be easily repositioned by connecting the transmission terminals on the mother board to the main line terminals corresponding to a desired pair of cable connecting members.

Moreover, if three main line terminals are arranged on the housing with two of the them located above, and on the right and left sides of the center of, the housing and the remaining one vertically aligned with one of the two terminals, different cable connecting members can be used as the input and output terminals by rotating the mother board 90 degrees on the center of the housing.

If the branch unit is provided with claws or guide lugs on both ends thereof and the mother board has matching holes formed therein, the branch unit can be detachably mounted on the mother board with one-touch operation. This structure allows the direction of the signals transmitted on the main line to be reversed simply by rotating the branch unit 180 degrees and mounting it back on the mother board.

Furthermore, even when the branch unit is detached from the mother board, the switch operates in response to the detachment so as to short-circuit the relay terminals. Therefore, the high-frequency signal transmission is not interrupted during replacement of the branch unit.

BRIEF DESCRIPTION OF THE DRAWINGS

FIG. 3 shows circuit diagrams of the components of the multi-tap distribution box;

BEST MODE OF CARRYING OUT THE INVENTION

An embodiment of the present invention will be explained with reference to the attached drawings.

Figure 1:
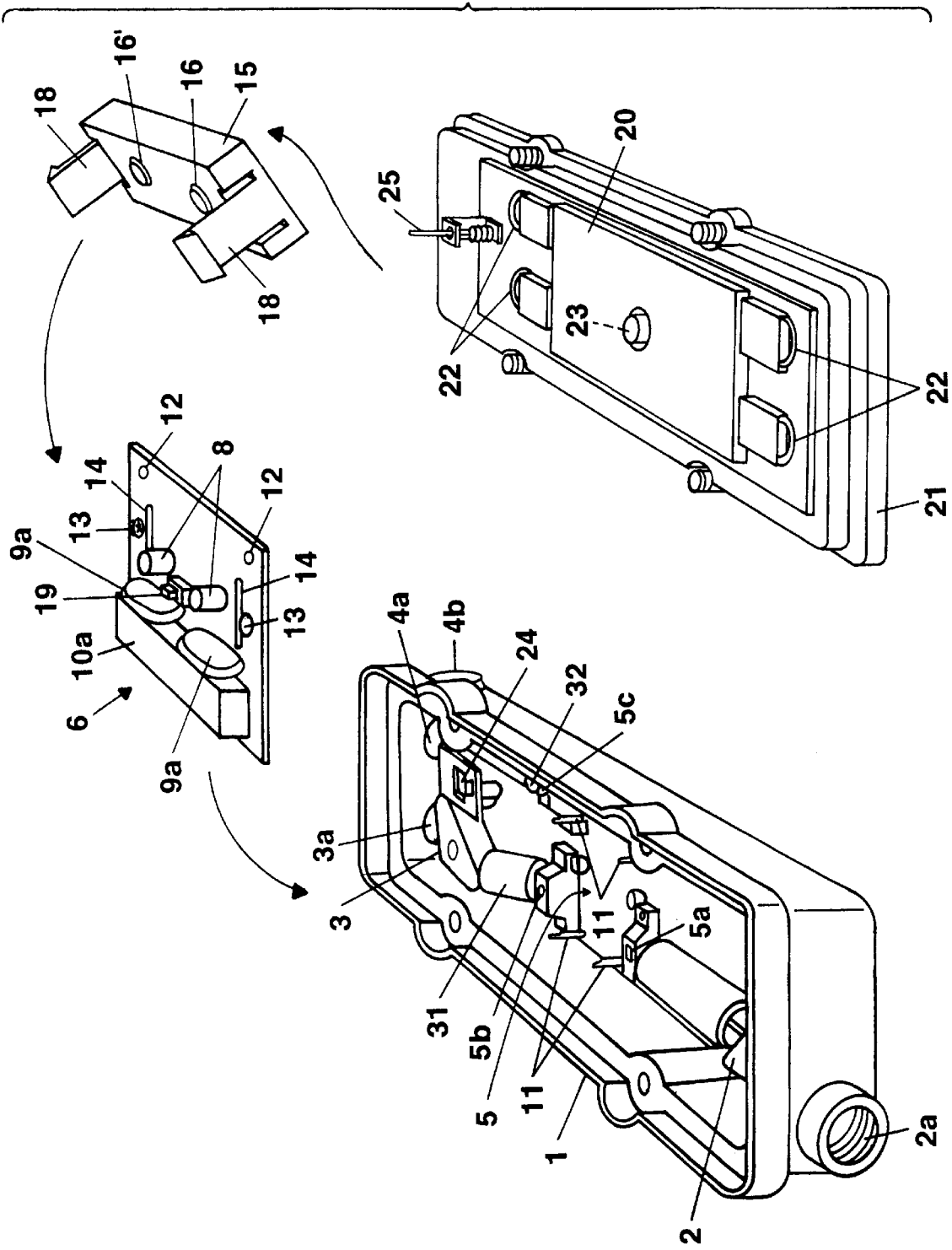
FIG. 1 is an exploded perspective view of a multi-tap distribution box of an embodiment of the present invention.
Figure 2:
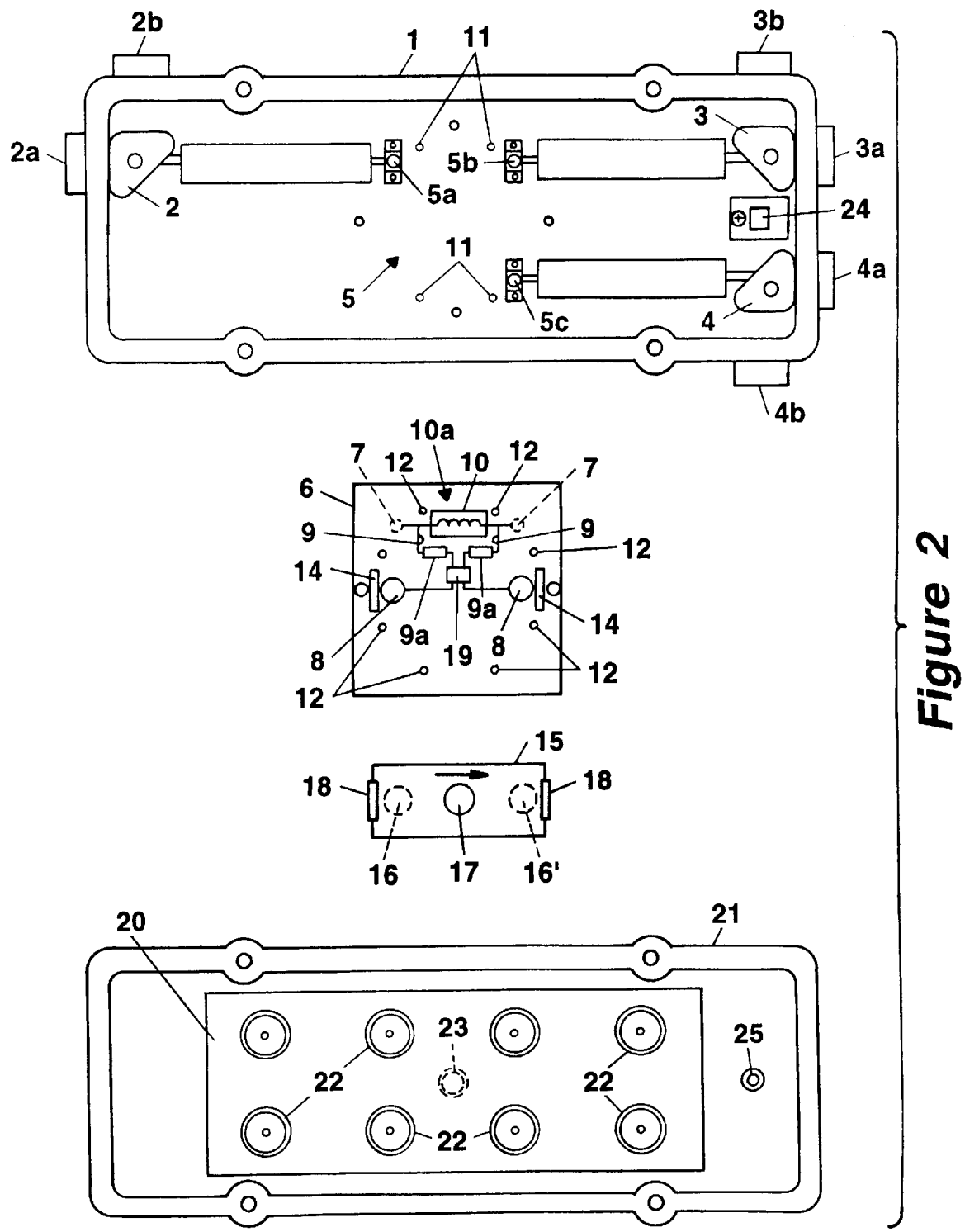
FIG. 2 shows plan views of the components of the multi-tap distribution box.

In FIGS. 1 to 3, reference numeral 1 designates a box-shaped housing with one side open. The housing 1 is provided with a single cable connecting member 2 on one end surface and two other cable connecting members 3 and 4 on the opposite end surface. Each of the cable connecting members 2, 3, and 4 is provided with a pair of cable insertion holes (2a, 2b; 3a, 3b; and 4a, 4b, respectively) in both sides of the corner adjacent to the cable connecting member.

The housing 1 includes an attachment portion 5 on which three main line terminals 5a, 5b, and 5c are provided. The upper terminals 5a and 5b are located above, and on the right and left sides of, the center P of the housing 1 while the terminal 5c is located directly under the right terminal 5b. The terminals 5a, 5b, and 5c are connected to the respective cable connecting members 2, 3, and 4 via transmission cables each comprising a central conductor inserted through a coaxial metal cylinder.

As constructed, each of these transmission cables has a layer of air between the outer and inner conductors. This structure minimizes the diameter of the coaxial metal cylinder, providing the advantage of causing only a small transmission loss.

In FIG. 2, reference numeral 6 is a mother board with a pair of transmission terminals 7 on its rear face and a pair of relay terminals 8 on its front face. The transmission terminals 7 are spaced so as to correspond with the main line terminals 5a and 5b (or 5b and 5c). Each of the transmission terminals 7 is connected to a relay terminal 8 via a high-frequency passing circuit 9 which includes a capacitor 9a. The circuit 9 allows high-frequency signals to pass therethrough. The two transmission terminals 7 are connected to each other by a current transmission circuit 10 which includes a coil 10a.

Also, the housing 1 has a plurality of guide pins 11 formed thereon while the mother board 6 has a plurality of guide holes 12 formed therein corresponding to the guide pins 11. The mother board 6 is mounted on the housing 1 by inserting the guide pins 11 into the guide holes 12. In this way, the transmission terminals 7 are easily aligned and brought into contact with, for example, the main line terminals 5a and 5b, which are not visible behind the mother board 6 during mounting. Then, the mother board 6 is secured to the housing 1 with a pair of screws 13. Also, the mother board 6 has a pair of engaging slits 14 formed therein outside the relay terminals 8.

Reference numeral 15 designates a box-shaped branch unit having on one surface a pair of connection terminals 16 and 16' which correspond to the relay terminals 8 of the mother board 6 and having on the opposite surface a branch terminal 17. The connection terminals 16 and 16' and the branch terminal 17 are connected to a built-in branch circuit. With the connection terminals 16 serving as the input terminal and the connection terminals 16' serving as the output terminal, the branch unit 15 can direct high-frequency signals. It also has on both ends thereof two engaging claws 18 projected toward the surface where the connection terminals 16 and 16' are located. When the branch unit 15 is mounted on the mother board 6 by engaging the claws 18 with the slits 14, the connection terminals 16 and 16' are brought into contact with the relay terminals 8.

Other methods for mounting the branch unit on the mother board are also possible without departing from the scope of the present invention. For example, the engaging claws formed on the branch unit may be replaced with guide lugs which are inserted into the slits formed in the mother board. Furthermore, screws or clips may be employed as the means of mounting the branch unit on the mother board.

The mother board 6 is provided with a push switch 19. When the branch unit 15 is mounted on the board mother 6, the outer surface of the branch unit 15 presses against and turns off the switch 19. When the branch unit 15 is detached from the board mother 6, the push switch 19 is released from the pressure of the unit 15 and turned on, thus short-circuiting the relay terminals 8 and allowing passage of high-frequency signals between the transmission terminals 7.

Moreover, the current transmission circuit 10 of the mother board 6 ensures that power currents and high-frequency signals flow between the transmission terminals 7 whether or not the branch unit 15 is mounted on the mother board 6.

Reference numeral 20 is a tap board mounted on the inner surface of a main body 21. The tap board 20 includes a distributing circuit and a plurality of external taps 22 exposed on the outer surface of the main body 1. The tap board 20 also has on its inner surface an input terminal 23 corresponding to the branch terminal 17 of the branch unit 15. The branch terminal 17 comes into contact with the input terminal 23 when the housing 1 and the main body 21 are assembled.

Additionally, a pair of contacts 24 and 25 are provided on the housing 1 and the main body 21, respectively, for allowing power currents to flow to the branch unit 15.

Figure 4A:
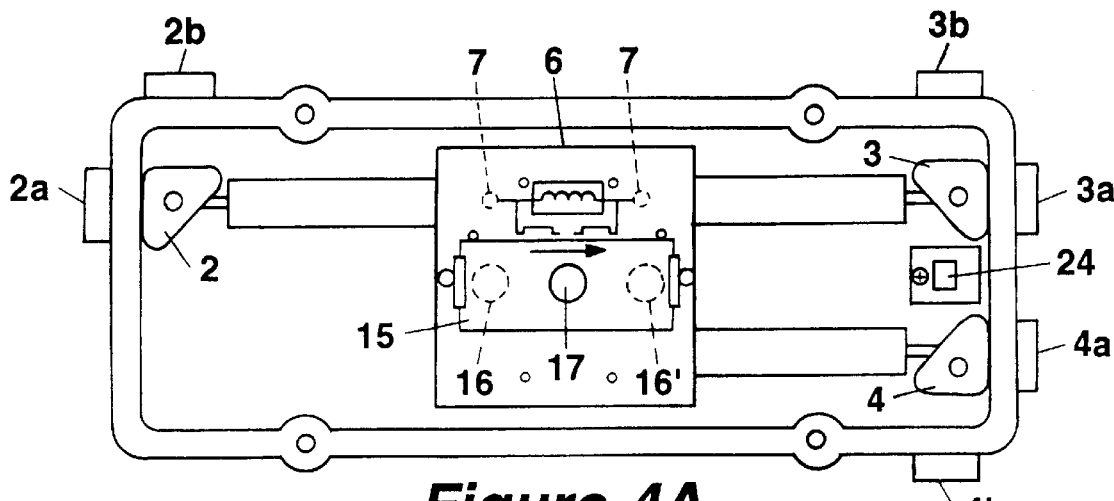
FIGS. 4A, 4B, and 4C show different pairs of input and output terminals.

Thus constructed, the multi-tap distribution box of this embodiment can be used as an aerial type device if the branch unit 15 is mounted on the mother board 6 with the terminal 16 on the same side as the cable connecting member 2 and the terminal 16' on the same side as the cable connecting member 3 as shown in FIG. 4A.

Figure 4B:
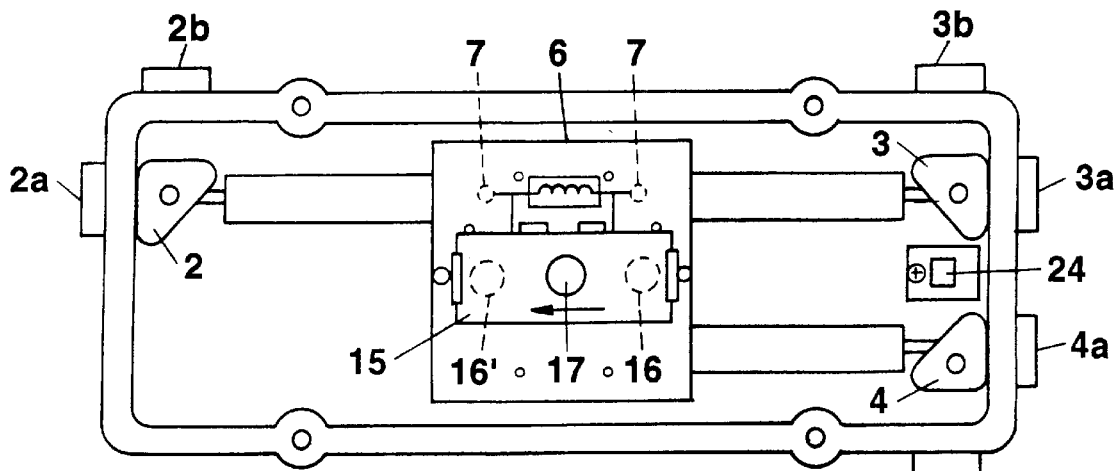

The positions of the input and output terminals can be easily reversed by detaching and horizontally rotating the branch unit 180 degrees and mounting it back on the mother board 6 (see FIG. 4B).

Figure 4C:
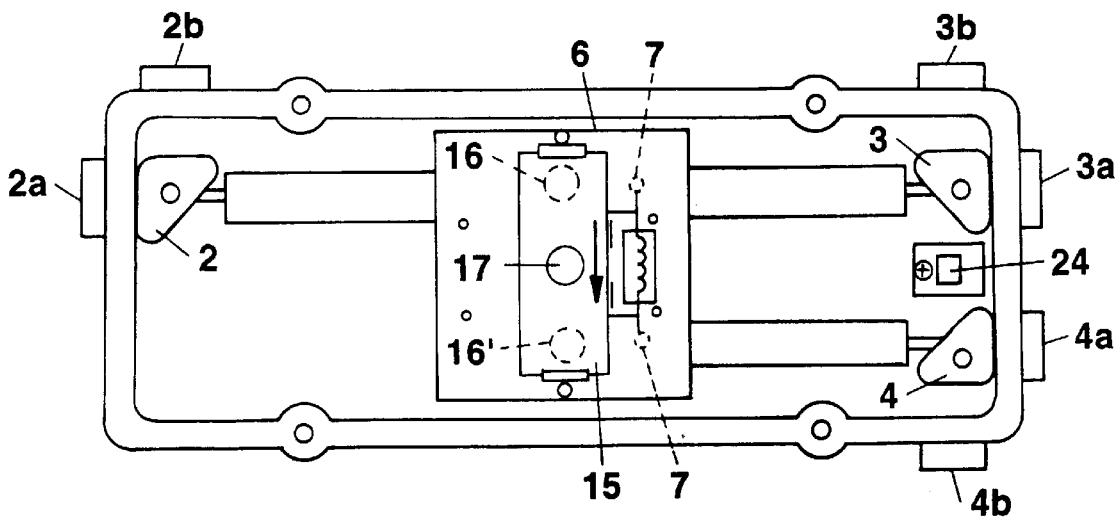
Figure 5A:
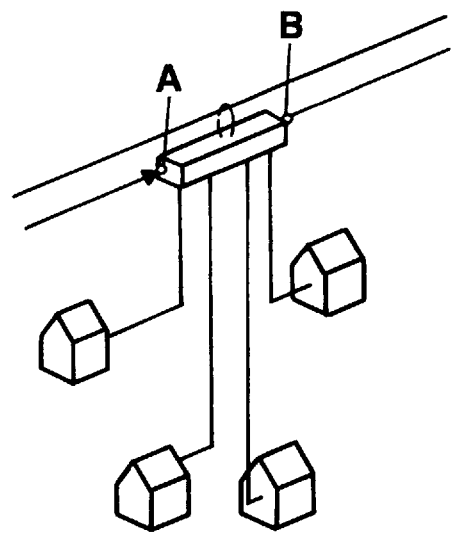
FIGS. 5A and 5B show prior art multi-tap distribution boxes in use.
Figure 5B:
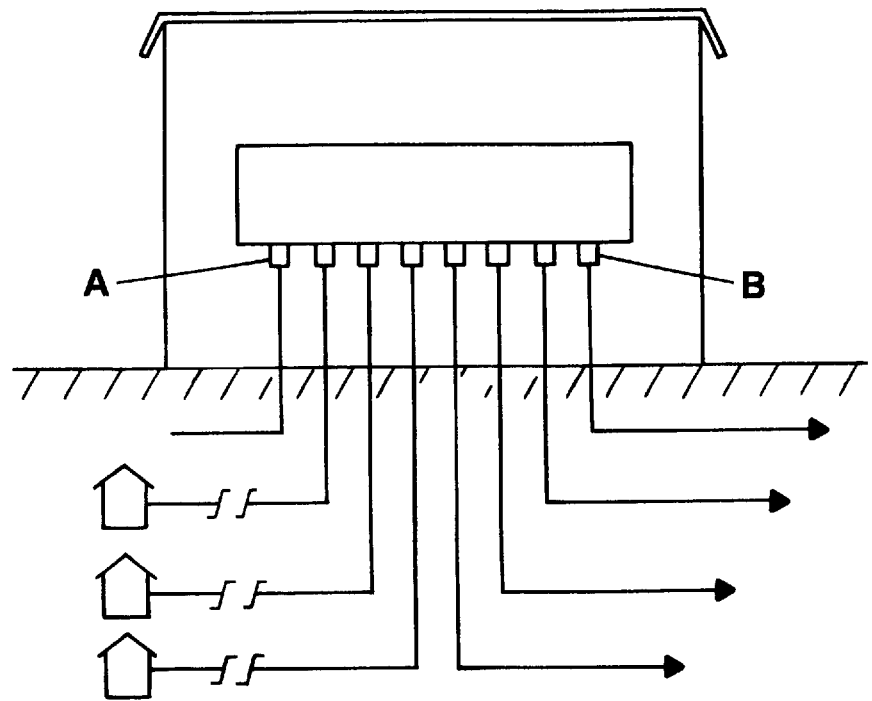

To use the multi-tap distribution box as a pedestal type device, the mother board 6 is detached and rotated 90 degrees in clockwise direction as shown in FIG. 4C, so that the connection terminals 16 and 16' are connected with the main line terminals 5b and 5c via the relay terminals 7. In this application, the cable connecting member 3 serves as the input terminal and the cable connecting member 4 as the output terminal. The positions of the input and output terminals can be easily reversed as in the aerial type application: by detaching and rotating the branch unit 15 hundred and eighty degrees and mounting it back on the mother board 6 (this position is not shown).

To change the number of branches (secondary cables), the main body 21, the tap board 20, and the branch unit 15 are replaced with a different main body with a tap board having a desired number of taps and a different branch unit.

To perform such replacement, the branch unit 15 can be easily detached by disengaging the claws 18 from the slits 14. Upon detachment of the branch unit 15, the switch 19 is turned on, thus short-circuiting the transmission terminals 7 and allowing high-frequency signal transmission between the cable connecting members. Accordingly, the high-frequency signal transmission remains uninterrupted while the branch unit 15 is replaced.

In this embodiment, different cable connecting members can be selected for use by rotating the mother board 90 degrees. Also, the number of taps can be increased or decreased by replacing the branch unit and the main body. Not only does this construction improve the operability of the multi-tap distribution box, but it also allows the multi-tap distribution box to be used as an aerial or pedestal type. Moreover, the multi-tap distribution box offers the advantage of maintaining the check function from a remote site even when the branch unit or the main body is removed since the transmission of the currents and the high-frequency signals from the input side to the output side remains uninterrupted.

Furthermore, since each cable connecting member is provided with a pair of cable insertion holes in its respective corner, cables can be more freely connected, that is, from two different directions.

In this embodiment, coaxial cables inserted into cable insertion holes are connected to the cable connecting members with screws. Instead of this construction, connectors may be provided in the multi-tap distribution box to couple cables.

Each cable connecting member may be provided with only one cable insertion hole or connector instead of two. Furthermore, the number of taps may be either increased or decreased; the main body may have any number of taps.

As described above, the embodiment includes three main line terminals on the inner surface of the housing. Two of the terminals are located above and on both sides of the center of the housing while the third terminal is located directly under one of the upper terminals. Accordingly, the pair of main line terminals of the mother board to be connected with the transmission terminals can be selected by rotating the mother board. Instead of this construction, equally spaced pairs of main line terminals may be arranged on the housing so that the transmission terminals are connected to any desired pair of main line terminals by shifting the mother board.

This concept of using different terminals as the input and output terminals by changing the mounting position of the mother board is applicable to other types of high-frequency signal devices and processors than multi-tap distribution boxes.

EFFECT OF THE INVENTION

According to the present invention, the positions of the input and output terminals, the number of the taps, and the transmission direction can be easily changed.

Since two of the main line terminals are used as the input and output terminals, the input and output terminals can be easily repositioned by rotating the mother board and the branch unit. Further, if the branch unit is provided with either claws or guide lugs for engaging or inserted into slits formed in the mother board, the branch unit can be mounted or detached with one-touch operation.

The mother board is also provided with a switch which short-circuits the relay terminals when the branch unit is detached. This switch operation maintains the transmission of the high-frequency signals between the cable connecting members while the branch unit is repositioned or replaced with a different one.

We claim:

1. A multi-tap distribution box comprising:
   a housing having one cable connecting member on one end thereof and two cable connecting members on the other end;
   the housing further having equally spaced pairs of main line terminals arranged on the center portion thereon, each of the main line terminals being electrically connected to a different one of the cable connecting members;
   a mother board having thereon transmission terminals spaced from each other so as to correspond to the distance between a pair of said spaced pairs of main line terminals, the transmission terminals being connected to each other by a current transmission circuit;
   the mother board having further thereon two relay terminals each of which is connected to one of the transmission terminals so that high-frequency signals are transmittable between a first pair of a first one of said relay terminals and a first one of said transmission terminals and between a second pair of a second one of said relay terminals and a second one of said transmission terminals, the mother board being detachably mounted on the housing so as to connect the transmission terminals of the mother board to a preselected one of said spaced pairs of main line terminals on the housing;
   a branch unit having a branch circuit, a pair of connection terminals, and a branch terminal, the branch unit being detachably mounted on the mother board for connecting the connection terminals to the relay terminals of the mother board;
   a tap board with a distributing circuit and an input terminal, the tap board being mounted on a main body; and
   the input terminal of the tap board adapted for connection to the branch terminal of the branch unit.

2. A multi-tap distribution box in accordance with claim 1, wherein the number of the main line terminals arranged on the housing is three, two of which are located above, and on the right and left sides of the center of, the housing with the remaining terminal vertically aligned with one of the two terminals.

3. A multi-tap distribution box in accordance with claim 1, wherein the branch unit comprises means on both ends thereof, for detachably mounting the branch unit to the mother board.

4. A multi-tap distribution box in accordance with claim 1 wherein the mother board further includes a switch operating in response to the mounting and detachment of the branch unit, for short-circuiting the relay terminals when the branch unit is detached from the mother board.

5. A multi-tap distribution box in accordance with claims 2 wherein the mother board further includes a switch operating in response to the mounting and detachment of the branch unit, for short-circuiting the relay terminals when the branch unit is detached from the mother board.

6. A multi-tap distribution box in accordance with claim 3 wherein the mother board further includes a switch operating in response to the mounting and detachment of the branch unit, for short-circuiting the relay terminals when the branch unit is detached from the mother board.

7. A multi-tap distribution box in accordance with claim 2 wherein the branch unit comprises means on both ends thereof, for detachably mounting the branch unit to the mother board.

8. A multi-tap distribution box in accordance with claim 7 wherein the mother board further includes a switch operating in response to the mounting and detachment of the branch unit, for short-circuiting the relay terminals when the branch unit is detached from the mother board.

* * * * *